United States Patent [19]

Suzuki et al.

[11] Patent Number: 5,253,197

[45] Date of Patent: Oct. 12, 1993

[54] SEMICONDUCTOR ASSOCIATIVE MEMORY DEVICE WITH CURRENT SENSING

[75] Inventors: Makoto Suzuki, Niiza; Suguru Tachibana, Hachioji; Hisayuki Higuchi, Kokubunji; Katsuhiro Shimohigashi, Musashimurayama; Takehisa Hayashi, Kodaira; Makoto Hanawa, Kokubunji; Tadahiko Nishimukai, Sagamihara, all of Japan

[73] Assignee: Hitachi, Ltd., Tokyo, Japan

[21] Appl. No.: 580,464

[22] Filed: Sep. 11, 1990

[30] Foreign Application Priority Data

Sep. 14, 1989 [JP] Japan ............................ 1-237044
Jan. 19, 1990 [JP] Japan ............................ 2-008253

[51] Int. Cl.$^5$ .......................................... G11C 15/04
[52] U.S. Cl. ............................... 365/49; 365/177; 365/189.07; 365/208
[58] Field of Search ................. 365/189.07, 177, 207, 365/208, 49

[56] References Cited

U.S. PATENT DOCUMENTS

| | | | |
|---|---|---|---|
| 4,866,673 | 9/1989 | Higuchi et al. | 365/177 |
| 4,910,711 | 3/1990 | Guo | 365/208 |
| 4,933,899 | 6/1990 | Gibbs | 365/177 |
| 4,942,555 | 7/1990 | Higuchi et al. | 365/189.07 |
| 5,014,195 | 5/1991 | Farrell et al. | 365/49 |
| 5,034,919 | 7/1991 | Sasai et al. | 365/49 |
| 5,046,050 | 9/1991 | Kertis | 365/177 |

FOREIGN PATENT DOCUMENTS 63-25889 2/1988 Japan.
63-119096 5/1988 Japan.

Primary Examiner—Joseph E. Clawson, Jr.
Attorney, Agent, or Firm—Antonelli, Terry, Stout & Kraus

[57] ABSTRACT

In a first embodiment of a CAM (Content Addressable Memory) or cache memory of the present invention disclosed herein, comparing information stored in a memory cell with comparison input information is accomplished in a comparison circuit without first converting a readout current from the memory cell into voltage information. In another embodiment, a matching detection between first stored information outputted from a first memory cell array and second stored information outputted from a second memory cell array is accomplished by an integrally formed sensing and matching detection circuit which is characterized as having both sensing and matching detection capabilities. That is, the sensing and matching detection circuit senses both stored information and thereafter detects matching based on a sensing result.

13 Claims, 11 Drawing Sheets

SEMICONDUCTOR ASSOCIATIVE MEMORY DEVICE WITH CURRENT SENSING

BACKGROUND OF THE INVENTION

1. Field of the Invention

The present invention relates to a semiconductor memory device and, in particular, to a memory circuit technology preferably for a memory device having a comparing (matching detection) capability.

2. Description of the Related Art

In a computer system such as a main computer, microprocessor or the like, a cache memory system for storing a part of the data in a main memory is used between a central processing unit (CPU) and the main memory for speed-up of operation of the computer system.

In this cache memory system, two types of memory devices having a comparing (matching detection) capability are used. Such types of memory devices determine whether or not a comparison data inputted externally matches with data stored in a first memory cell array, then accessing of a separately arranged second memory cell array is effected based on the result of the comparison. Therefore, they function as a CAM (Content Address Memory).

A first type of cache memory is an address translation cache memory for supporting a virtual memory system. In the address translation cache memory, a logical address of an instruction or data required by a central processor unit and the like is inputted to the first memory cell array to determine whether corresponding physical address is present in the second memory cell array. The physical address in accordance with the determination and a result of the comparison are then outputted from the second memory cell array. The address translation cache is also referred, to as TLB (Translation Look-aside Buffer) in which a logical address of data from the central processing unit is inputted to the first memory cell array (LA) and a detection is carried out of whether or not the logical address of data is a match with a logical address already stored the first memory cell array (LA). By this matching, that is detection operation, a determination is made of whether or not the physical address corresponding to the logical address inputted to the first memory array (LA) is present in the second memory cell array (PA) for storing the physical address. The physical address in accordance with the determination and the result of the determination are outputted from the second memory cell array.

A second type of cache memory stores a part of an instruction or data stored in the main memory device with the physical address to thereby be an instruction or data cache memory serving as a high speed buffer memory. By inputting the physical address to the first memory cell array, a determination is made of whether or not a corresponding instruction or data is present in the second memory cell array. The instruction or data in accordance with the determination and the result of the determination are outputted from the second memory cell array.

As mentioned above, a CAM or cache memory should be capable of comparing comparison input data with data already stored in the first memory array and outputting a result of determination of whether or not the input data and stored data are a match.

A conventional approach for achieving a comparison function (matching detection function), is exemplified by the comparator circuit coupled to respective memory cells, such as, disclosed in Japanese Patent Application Publication No. JP-A-63-25889.

Another known approach uses a circuit of the type in which a comparator circuit for comparing input data with data stored in a memory cell is provided between the memory cell and a sensing circuit to thereby provide a wired logical operation in accordance with an output signal from the sensing circuit, then a comparison result of n-bits is effected. Such an arrangement is disclosed in Japanese Patent Application Publication No. JP-A-63-119096.

In the circuit described in Japanese Patent Application Publication No. JP-A-63-119096, since read data (having a very small voltage swing) of a signal outputted from the memory cell on a data line is compared with input data to be compared, it is possible to operate the circuit at high speed. Since the data being inputted to the comparator circuit is without amplification. In addition, in this circuit, it suffices to connect a differential sensing circuit to each bit of the memory array via the comparator circuit. Therefore, the circuit system has advantages in that an occupied area of the circuit and its power consumption can be reduced in comparison with the above-mentioned system which carries out a detection of matching. That is, the detection of matching is carried out in the comparator circuit after converting readout data from the memory cell array into a certain level because both the differential sensing circuit and the amplifying level converting circuit are arranged for each bit of the memory cell array.

SUMMARY OF THE INVENTION

In the conventional arts described above, the Japanese Patent Application Publication No. 63-25889 has a problem that the occupied area of a memory cell per one bit is large, and it is difficult to store a large amount of data since a comparator circuit for comparing input data with stored data in a memory cell is required for each memory cell.

In the Japanese Patent Application Publication No. JP-A-63-119096 however, data is read out to a bit line from an ordinary memory cell (memory cell in which comparator circuit is not arranged for each memory cell), and the readout data is converted into a voltage signal by a bit line load and, thereafter, comparison of each one bit is accomplished by a comparator circuit, so that a result of the comparator circuit is detected by a differential sensing circuit. Because of this, speed-up of operation is hindered since the delay times are exceedingly long because of the number of signal processing stages required, such as conversion to voltage signal, comparison and differential sense operations. Also, since it is necessary to arrange the differential sensing circuit for each bit line, n number of differential sensing circuits are required for comparing n-bit data. There is, therefore, a problem in power consumption also.

In the Japanese Patent Application Publication No. JP-A-63-119096, a matching detection of a comparator circuit is carried out by turning a MOS transistor on and off and is controlled by input data to be compared. Accordingly, this comparison circuit is preferable for a matching detection circuit of a first memory cell array (LA) for storing a logical address of TLB to which a sufficient signal amplitude is given as the input data to be compared. However, in order to detect a matching between a physical address information with an instruction having a very low signal level which is outputted from a second memory cell array (PA) for storing a physical address of TLB and an address information having a very low signal swing which is outputted from a tag (TAG) memory of an instruction or a data cache memory, it is necessary to once convert a readout signal of either the physical address information or the address information (both having the very low signal level) into a certain level of amplitude, and then detect a matching. There are therefore problems of speed-up and power consumption.

The present invention is proposed in consideration of the above mentioned problems associated with that conventional. It is an object of the present invention to provide a semiconductor memory device having a comparing and matching detection capability with a high speed operation and low power consumption.

In a first embodiment, the above-mentioned object is accomplished by comparing information stored in a memory cell with inputted information to be compared in a comparator circuit without requiring conversion of a readout current from a memory cell into voltage information. More specifically, the readout current from the memory cell is supplied to either a source and drain path of a transfer MOSFET or an emitter and collector path of a bipolar transistor to thereby input comparison data to a gate of the transfer MOSFET or a base of the bipolar transistor, which carries out a comparison operation. In addition, a result of the comparison is operated by a wired logical circuit, so that a final comparison result of n-bits is obtained.

In a second embodiment, the above mentioned object of the present invention is accomplished by carrying out matching detection when comparing first stored information (for example, physical address information) outputted from a first memory cell array (for example, memory array (PA) for storing a physical address of a TLB which is an address translation cache) with second stored information (address information) outputted from a second memory cell array (for example a TAG memory for storing an address of the instruction or data cache memory) by means of a sensing and matching detection circuit which is capable of intergrally performing both the sensing and matching detection operations That is, the sensing and matching detection circuit has an intergral function including both sensing the first and second stored information and detecting matching of the first and second stored information. The sensing and matching detection circuit senses both the first and second stored information, and then carries out matching detection based on the result of sensing.

In accordance with the first embodiment of the present invention, comparing information stored in the memory cell with input information to be compared, is carried out by a comparator circuit without any conversion of a readout current from the memory cell into voltage information. Therefore, signal processing such as conversion of a current signal to a voltage signal prior to comparison operation at the comparator circuit may be omitted. Each output from the plurality of the comparison circuits may be synthesized by the wired logical circuit. In accordance with this embodiment, it suffices to dispose one sensing circuit for converting a readout current flowing from a memory cell to the synthesized output into a voltage. Thus, the semiconductor memory device in the present invention may achieve matching detection capabilities with a high speed operation and low power consumption.

In accordance with the second embodiment, detection of matching of first information outputted from a first memory cell array with second information outputted from a second memory cell array, is carried out by a sensing and matching detection circuit in which sensing and matching detection capabilities are combined in an intergral arrangement. The intergral arrangement of the sensing and matching detection circuit both senses a first and second stored information, and then carries out matching detection based on the sensing result. The conventional circuit system described in the above mentioned Japanese Patent Application Publication No. JP-A-63-119096 carries, on the other hand, out matching detection of both the first and second stored information, and then carries out sensing operation based on the result of the matching detection. In the conventional circuit when either the first or second stored information detected for comparison has a very small signal swing level, there is a likelihood of malfunction in the matching detection operation due to variation in characteristics of the comparator circuit. In contrast to this, in the second embodiment of the present invention, even if both the first and second stored information have a very small signal swing level, both the first and second stored information are still accurately sensed, then matching detection is carried out based on a sensing result. Therefore, the malfunction described above is remarkably reduced. The sensing and matching detection circuit which intergrally has both the sensing and matching detection capabilities is advantageous in that it facilitates a high speed operation and low power consumption.

Other objects and advantages of the present invention will be readily understood from the following description of the embodiments.

DESCRIPTION OF THE PREFERRED EMBODIMENTS

Figure 1:
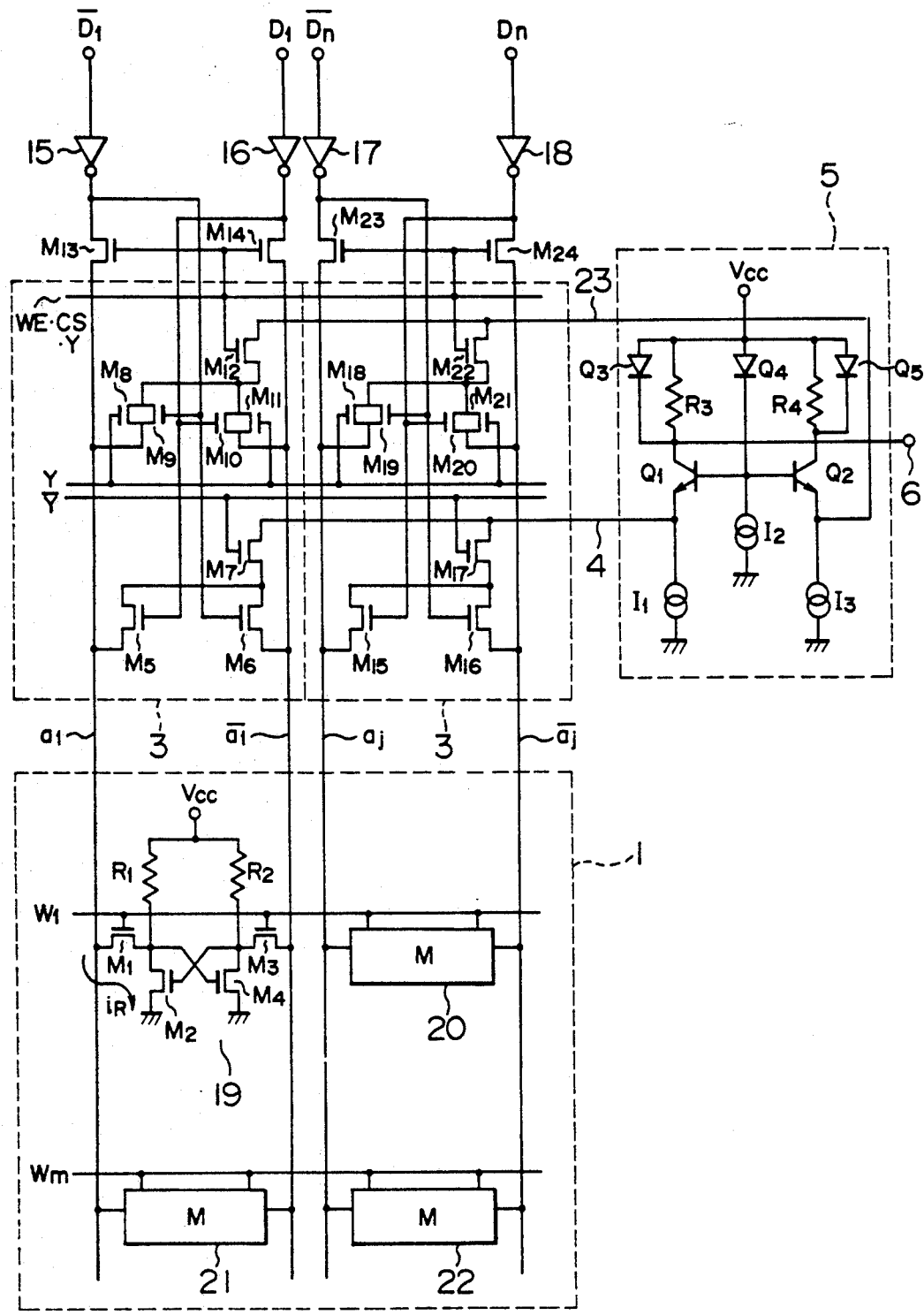
FIG. 1 is a circuit diagram showing an example of a semiconductor memory device in accordance with a first embodiment of the present invention.
Figure 2:
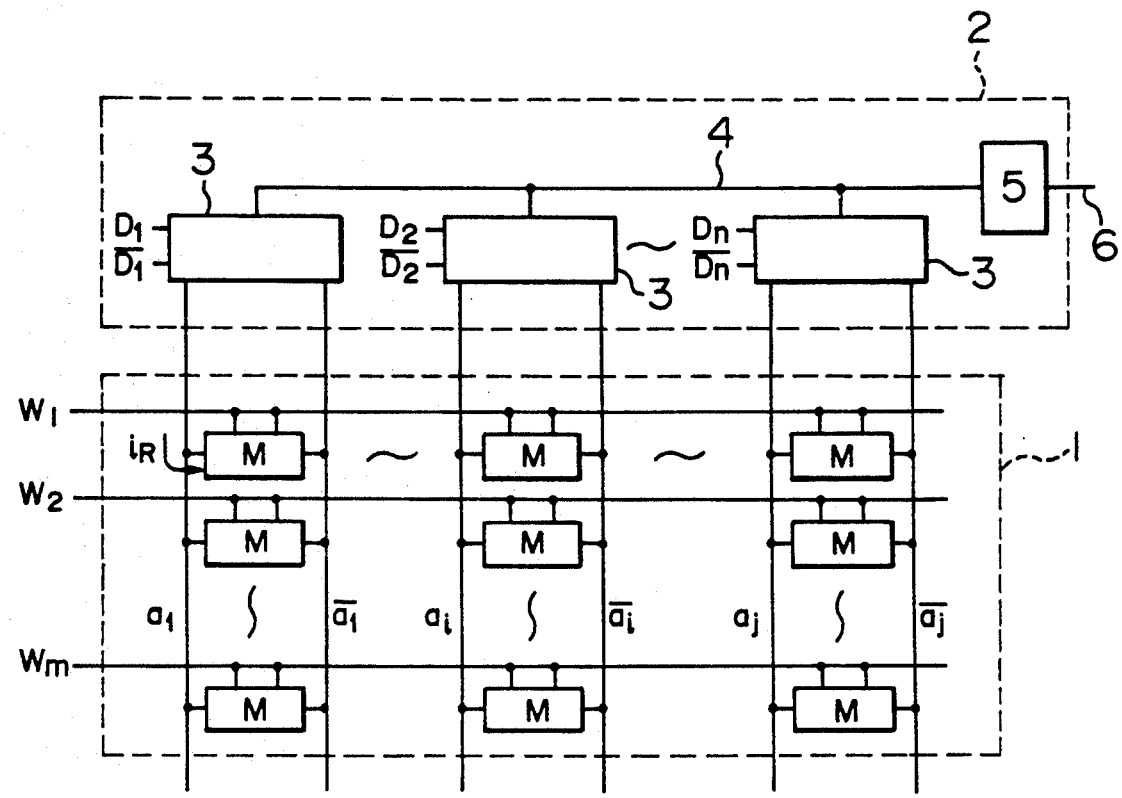
FIG. 2 is a block diagram schematically showing the circuit shown in FIG. 1.
Figure 3:
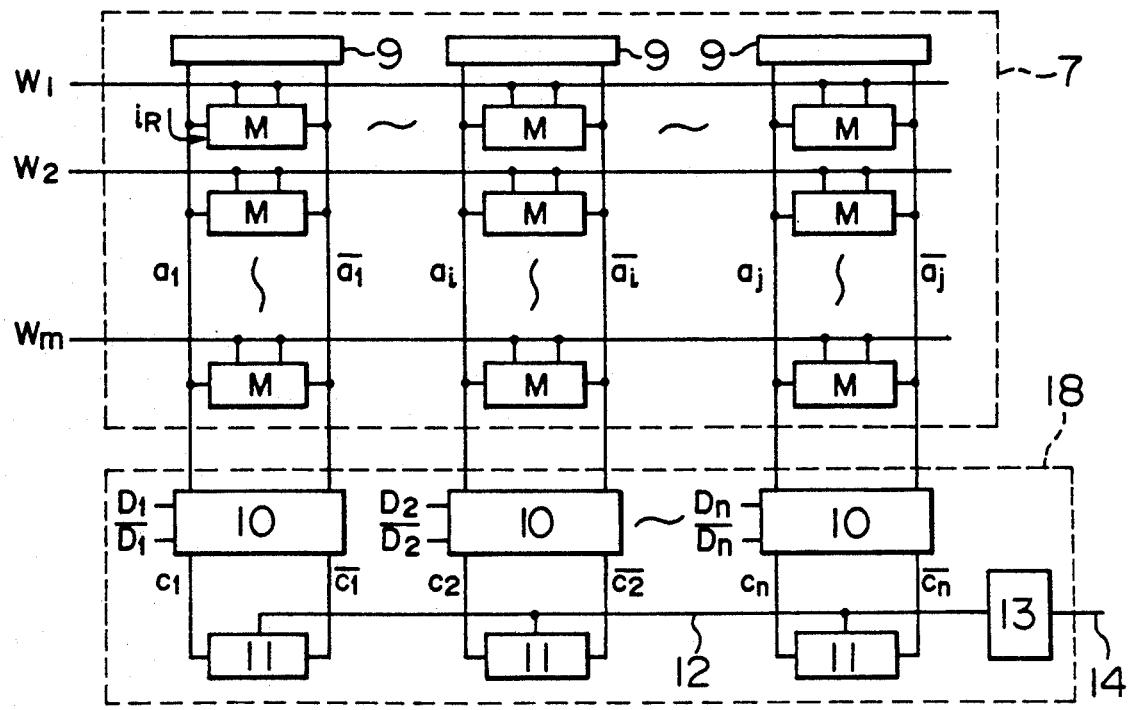
FIG. 3 is a block diagram schematically showing a circuit of a prior art semiconductor memory device.

Hereinafter, the present invention will be described with reference to the drawings. FIG. 1 is a circuit diagram showing an example of a first embodiment of the present invention in detail. FIG. 2 is a block diagram schematically showing the detailed circuit shown in FIG. 1. FIG. 3 is a block diagram schematically showing the detailed circuit of the prior art memory device disclosed in the above mentioned Japanese Patent Application No. JP-A-63-119096.

Firstly, the operation and structure of a memory device of the present invention will be described in comparison with the prior art memory device with reference to FIGS. 2 and 3.

In the block diagram of the memory device shown in FIG. 2, reference numeral 1 denotes a memory cell array, 2 denotes an n-bits comparator circuit, 3 a one-bit comparator circuit, 4 a wired logic circuit, 5 a sensing and amplifying circuit, 6 a n-bits comparison result signal, M denotes memory cells, $W_1$, $W_2$, ..., $W_m$ denote word lines, $a_1$, $\overline{a_1}$, ..., $a_i$, $\overline{a_i}$, ..., $a_j$, $\overline{a_j}$ denote pairs of data lines, $D_1$, $\overline{D_1}$, $D_2$, $\overline{D_2}$, ..., $D_n$, $\overline{D_n}$ denote trains of n-bits input data to be compared.

In the prior art memory device shown in FIG. 3, the same reference numerals in FIG. 2 are used in FIG. 3 for the same constructions, a reference numeral 7 a memory cell array, 18 an n-bits comparator circuit, 9 denotes load circuits of data line pairs, 10 one-bit comparator circuits, 11 one-bit differential sensing circuits, 12 a wired logic circuit, 13 a sensing and amplifying circuit, 14 an n-bits comparison result signal, $C_1$, $\overline{C_1}$, $C_2$, $\overline{C_2}$, ..., $C_n$, $\overline{C_n}$ denote a one-bit differential comparison result signal.

In the prior art memory device shown in FIG. 3, readout current $i_R$ from the memory cell M is supplied to the load circuits 9 of the data line pairs to thereby convert information of the readout current $i_R$ into voltage information. Thereafter, the converted voltage information is inputted to the one-bit comparator circuit 10 to compare with comparison input data, then a result of the comparison in the comparator circuit 10 is sensed by the differential sensing circuit 11. The logical operation of the outputs from the plurality of differential sensing circuits 11 are carried out in the wired logical circuit 12, and lastly sensed and amplified by the sensing and amplifying circuit 13 to thereby obtain a n-bits comparison result signal 14 having a desired amplitude.

In contradistinction with this, in the memory device shown in FIG. 2, a readout current $i_R$ from the memory cell M is inputted to the one-bit comparator circuit 3 and is compared with the comparison input data without converting it to voltage information. The logical operation of current output signal as a comparison result obtained from the comparison circuit 3 is directly carried out by the wired logical circuit 4 without using any differential sensing circuit, and is lastly sensed and amplified by the sensing and amplifying circuit 5 to thereby obtain a n-bits comparison result signal 6 having a desired amplitude.

Accordingly, the n number of sensing circuits shown in FIG. 3 is not required for the circuit shown in FIG. 2, making it possible to achieve a device that has a relatively low power consumption. Furthermore, noting that the readout current $i_R$ from the memory cell is not first converted into voltage information prior to the comparison operation, and also, the fact that detection of a comparison result by a sensing circuit is not required, a comparison result according to FIG. 2 can be rapidly obtained.

Now, the memory device is described in detail with reference to FIG. 1. In this example of the circuit shown in FIG. 1, the same reference numerals in FIG. 2 are used in FIG. 1 for the same constructions. Portions including inverter circuits 5 through 18 and N channel type MOSFET (hereinafter abbreviated as NMOS) M13, M14, M23, M24 denote write circuits and circuits for inputting data to be compared.

The write operation of data will be described. In the circuit shown in FIG. 1, input terminals for data to be compared $D_1$, $\overline{D_1}$, $D_n$, $\overline{D_n}$ also function as input terminals for data to be written. The write operation of data is carried out by the following operation so that a write control signal WE.CS.Y is made a high level (hereinafter high) and low levels will be referred to as H and L levels, respectively) to thereby turn on the Y switches M13, M14, M23 and M24 of NMOS for use in writing, and drive either one of the data line pairs to L level by means of the inverter circuits 15 to 18 for use in writing. A Y signal which is a column selection signal that selects a desired column from a plurality of columns.

Now, a case in which an L level data is written into a memory cell 19 will be described.

In this case, signals $a_1$ and $\overline{a_1}$ become L and H levels, respectively, by inputting data $D_1$ and $\overline{D_1}$ which are L and H levels to the memory cell 19, respectively. By selecting the word line $W_1$ as H level, data $D_1$ of L level is written into the memory cell 19 comprising NMOSs M1 through M4, and resistive elements R1 and R2 in which M2 and M4 become conductive and nonconductive, respectively.

A comparison operation will be described next. In this case, the write control signal WE.CS.Y is made L level and the NMOS Y switches M13, M14, M23 and M24 for use in writing are made nonconductive. On the other hand, P channel type MOSFETs (hereinafter abbreviated as PMOS) M5 through M7, M15 through M17 carry out a comparison operation as follows: PMOSs M7 and M17, are operated as the Y switches for the comparison operation. PMOSs M7 and M17 are conductive when a column selection signal Y is L level.

The comparison operation is now considered in connection with data for use in writing. When comparison input data $D_1$ and $\overline{D_1}$ of L and H levels, respectively, that is, data for use in writing is compared with stored data, a readout current $i_R$ flows from the memory cell 19 to the data line $a_1$, however, since PMOS M5 and M6 are conductive and nonconductive, respectively, the readout current $i_R$ does not flow through a matching signal line 4.

On the other hand, when comparison input data $D_1$ and $\overline{D_1}$ of H and L levels, respectively, that is, data not used in writing, that is mismatched data, is compared with stored data, since PMOS M5 and M6 are conductive and nonconductive, respectively, the readout current $i_R$ flowing through data line a1 from the memory cell 19 flows through the matching signal line 4 via PMOS M5 and M7.

The device operates similarly when the data stored in the memory cell are reversed. The readout current $i_R$ flowing through the data line $a_1$ therefore does not flow through the matching signal line 4 when the comparison input data matches with stored data. The readout current $i_R$ flows through the matching signal line 4 via PMOSs M6 and M7 when both data are a mismatch.

Accordingly, in the circuit of the embodiment, since PMOS M5 and M6 operate as an ENOR (exclusive NOR) circuit which compares comparison input data with data stored in the memory cell, the readout current $i_R$ of the memory cell does not flow through the matching signal line 4 when the data match with each other, while the readout current $i_R$ flows through the matching signal line 4 when data do not match with each other. Therefore, comparison of data with stored data is possible without first converting the readout current $i_R$ from the memory cell into voltage information.

The write and comparison operation of another column including data line pair $a_j$, $\overline{a_j}$ or that of an n-th column is similarly obtained.

The matching signal line 4 commonly handles the comparison result of the one-bit and the comparison result of the other $(n-1)$ bits, forming a wired AND circuit. That is, the readout current flows through the matching signal line 4 when any one bit of the comparison result does not match with each other. The current does not flow through the matching signal line 4 only when all bits match with each other. Therefore, the comparison result of all n bits is present in the matching signal line 4 in the form of the readout current from the memory cell.

This detection current of the matching signal line 4 is sensed and amplified by a high frequency amplifier comprising an NPN bipolar transistor Q1 (hereinafter abbreviated as NPN transistor) having a grounded base and a resistive element R3.

A constant current source $I_1$ which is connected with the emitter of the NPN transistor Q1 having the grounded base, is adapted to suppress the voltage swing of the signal line 4 to enable the line to operate fast. A circuit comprising a diode connected NPN transistor Q4 and a constant current source $I_2$ forms a base bias circuit for supplying the NPN transistor Q1 with a constant base potential. A diode connected NPN transistor Q3 is adapted to clamp the lowering of the collector potential of the NPN transistor Q1 to prevent the transistor Q1 from being saturated.

Accordingly, in the circuit of the embodiment, a comparison H or L level can be obtained, that is, the comparison result signal becomes an H level at an output terminal 6 when both data match with each other, and L level when both data do not match with each other.

In FIG. 1, PMOSs M8 through M12 or M18 through M22 form a circuit for bypassing the readout current $i_R$ from the memory cell. In other words, the readout current $i_R$ is bypassed to a bypass line 23 via M12 or M22 which is conductive since non-selected columns M8, M11 or M18, M21 are brought into the conductive state responsive to an L level column selection signal Y.

Since the gates of PMOSs M9, M10 or M19, M20 are controlled by a comparison input data having a logical level opposite to that of a comparison input data, the readout current from the memory cell is bypassed to the bypass line 23 when both data match with each other.

PMOS M12 or M22 which is controlled by the write control signal WE.CS.Y becomes conductive in all columns in a comparison operation. PMOS M12 or M22 becomes nonconductive only in columns which are selected in a write operation for off path of a direct current load of the data line to facilitate the write operation.

In a write operation, PMOSs M5, M6 or M15, M16 which are connected with the data line for writing L level, become nonconductive to similarly cut off a path of the direct current load of the data line to facilitate the write operation.

On the other hand, PMOSs M5, M6 or M15, M16 which are connected with data line for writing an H level, become conductive to an pull up the potential of the data line to H level for preventing the potential of the data line from becoming unstable.

A circuit comprising an NPN transistor Q2, a resistor element R4, a constant current source $I_3$ and a diode connected NPN transistor Q5 forms a load circuit for the bypass line 23. The circuit can be made the same as a circuit comprising the NPN transistor Q1, the resistor element R3, the constant current source $I_1$ and the diode connected NPN transistor Q3, so that potential changes among data line pairs is suppressed to shorten extension of the delay time due to the change in potential.

Although the example using PMOSs M5, M6 or M15, M16 as elements forming a comparator circuit 3 is shown in FIG. 1, it is apparent that the PMOSs may be replaced with NMOS or NPN or PNP bipolar transistors which are controlled at their base electrodes.

Although an example in which memory cells having high impedance loads, including polycrystalline silicon resistors R1, R2, is described above, it is apparent that different types of memory cell circuits are also applicable, including: complete CMOS type memory cell, bipolar type memory cell, read-only memory cell, nonvolatile memory cell, memory cell from which stored information is read as a current. That is, the circuit structure is not limited to the circuit of this example and, therefore, a modification therefor alternative construction can also be employed.

Figure 4:
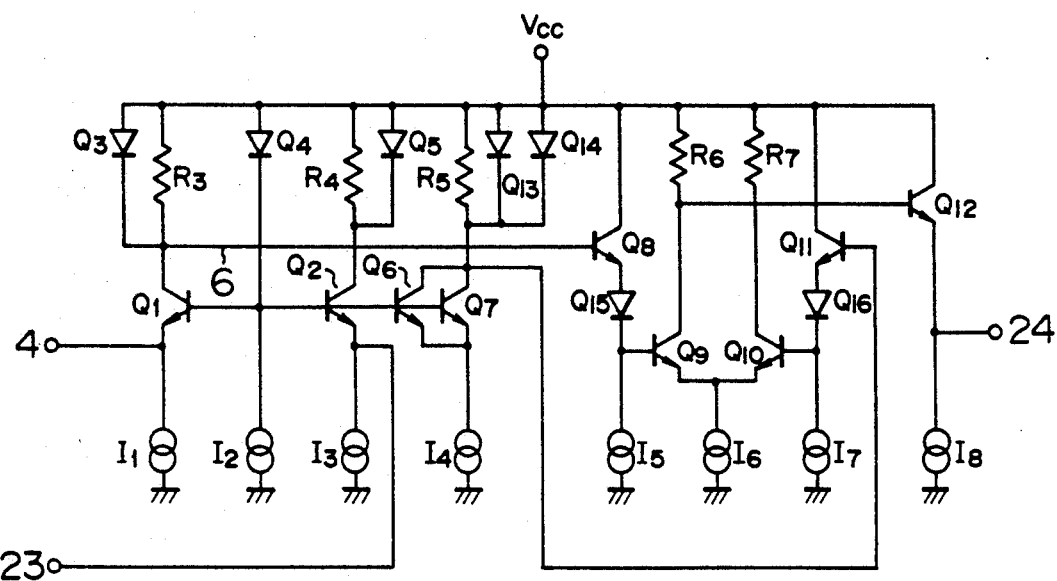
FIG. 4 is a circuit diagram showing another example of a circuit of a sensing and amplifying circuit preferably used for a sensing and amplifying circuit in the example shown in FIG. 1.

FIG. 4 shows another modified example of a sensing and amplifying circuit which is is applicable as the sensing and amplifying circuit 5 of the example shown in FIG. 1.

In FIG. 4, the same reference numerals in FIG. 1 are used in FIG. 4 for the same construction. A circuit comprising NPN transistors Q8 through Q11, resistor elements R6, R7, diode connected NPN transistors Q15, Q16, and constant current sources $I_5$ through $I_7$ forms a ECL type differential amplifying circuit. A circuit comprising an NPN transistor Q12 and a constant current source $I_8$ forms an emitter follower output circuit. A circuit comprising NPN transistors Q6, Q7, resistor element R5, diode connected NPN transistors Q13, Q14 and a constant current source $I_4$ is adapted to supply a reference direct current voltage to the above mentioned ECL type differential amplifying circuit.

The circuit shown in FIG. 4 has a feature that it outputs a comparison result signal 24 having a desired amplitude at a high speed by further amplifying an output signal of the sensing and amplifying circuit 5 of the example shown in FIG. 1.

The above mentioned ECL type differential amplifying circuit makes it possible to set a low voltage signal swing across the resistor element R3 and a low resistance of the resistor element R3 which are driven by the readout current $i_R$ from at least one memory cell. Accordingly, a delay time determined by the resistance value of the resistor element R3 and a capacitance of the transistor Q1 may be shortened, thereby resulting in speed-up of the sensing and amplifying circuit.

In order to operate the above mentioned ECL type differential amplifying circuit, it is necessary to preset a voltage generated by the reference voltage generating circuit (Vcc−$I_4R_5$) between a matching signal level at H level (Vcc−$I_1 R_3$) and a maximum value of a mismatched signal level at L level (Vcc−$I_1R_3-i_RR_3$) occurring on the signal line 6. It is apparent that a minimum value of the mismatched signal level at L level occurring on the signal line 6 is (Vcc−$I_1R_3-i_R\cdot n\cdot R_3$).

Figure 5:
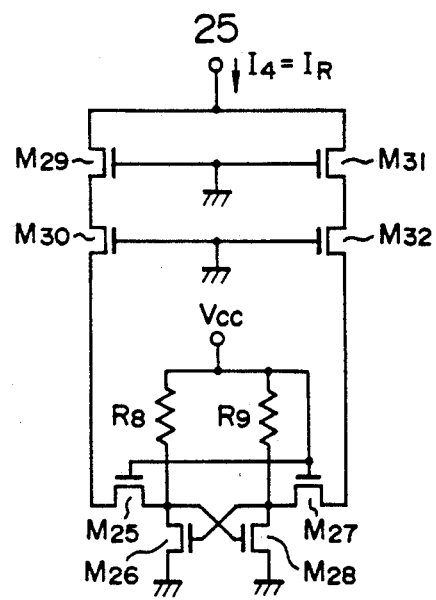
FIG. 5 shows an example of a circuit which may be used as a constant current source $I_4$ in the circuit shown in FIG. 4.

The constant current source $I_4$ shown in FIG. 4, which operates as a circuit for monitoring the readout current from the memory cell with accuracy, may be realized, and, for example, by the circuit shown in FIG. 5.

In FIG. 5, a dummy memory cell comprising NMOSs M25 through M28 and resistor elements R8, R9 is substantially identical with the memory cell M of the example shown in FIG. 1. PMOSs M29, M30 or M31, M32 having the same size as PMOSs M5, M7 and the like of the example shown in FIG. 1, are used for accurately monitoring the readout current $i_R$ from the memory cell shown in FIG. 1. Accordingly, a constant current $I_4$ which is substantially equal to the readout current $i_R$ from the memory cell shown in FIG. 1 may be obtained at a terminal 25 in FIG. 5.

In FIG. 4, it is possible to set the reference voltage value as (Vcc−$I_1R_3-0.5i_RR_3$) by coupling the constant current sources $I_4 (\approx i_R)$ and $2I_1$ with the emitters of the transistors Q6, Q7, thereby making the resistance of the resistor element R5 a half resistance value of the resistor element R3.

Furthermore, the constant current source circuit may be simplified so that $I_1=i_R$, $I_4=3i_R$.

Figure 6:
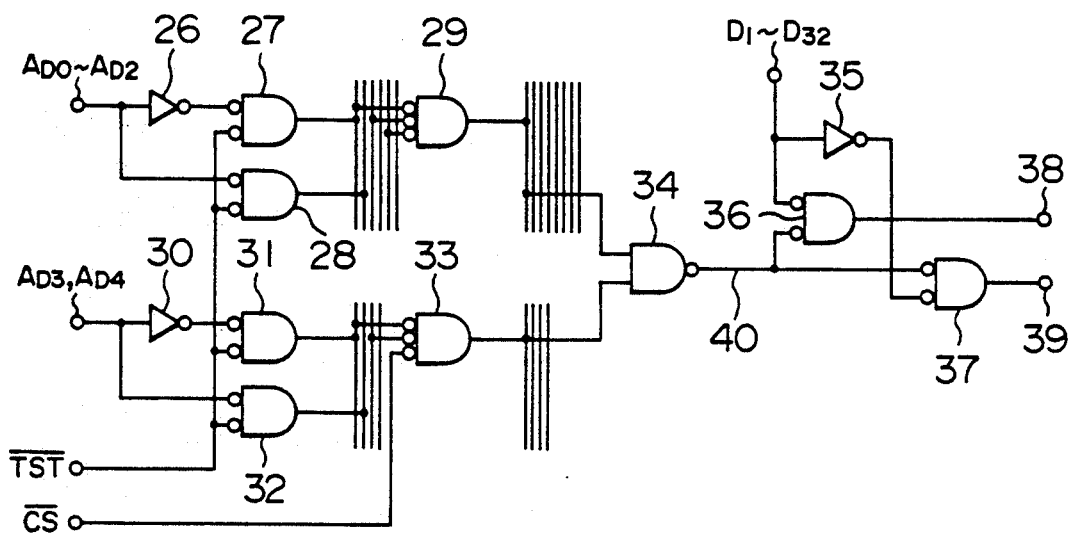
FIG. 6 shows an example of a circuit for generating a comparison input data supplied to a semiconductor memory device shown in FIG. 1.

Although a power source terminal Vcc is connected with the gates of the transfer MOSFETs, M25, M26 in the dummy memory cell as a constant current source $I_4$ in the circuit shown in FIG. 5, another approach is possible as long as the readout current from the memory cell is not changed FIG. 6 shows a circuit of a further embodiment, which may be preferably used for the circuit for generating comparison input data $D_1$, $\overline{D_1}$, $D_n$, $\overline{D_n}$ in FIG. 1.

The circuit shown in FIG. 6 has a feature that a comparison result of n-bits may be obtained, but the circuit also makes it possible to compare each bit of data, enabling an examination for each bit pertaining to a memory cell for the presence of a defect.

In other words, FIG. 6 shows a circuit having a capability of examination for defective bits of each bit of the 32-bits comparison input data $D_1$ through $D_{32}$ in the memory cell. Illustration of circuit part like to that of previous drawing is omitted.

In FIG. 6, 5-bit address signals $A_{D0}$ through $A_{D2}$, $A_{D3}$, $A_{D4}$ select one bit among 32-bits comparison data input signal D1 through D32.

Inverters 26, 30 and three, other identical inverters (not shown) are adapted to generate a negation signal of address.

An three-input NOR circuit 29 and seven other, identical three-input NOR circuits (not shown) are adapted to predecode 3-bit address signals $A_{D0}$ through $A_{D2}$, an 3-input NOR circuit 33 and three, other identical 3 input NOR circuits (not shown) are adapted to predecode 2-bit address signals $A_{D3}$ and $A_{D4}$.

A two-input NAND circuit 34 and 31 other, identical two input NAND circuits (not shown) are adapted to decode the two predecoded signals.

An inverter 35 and 31 other, identical inverters are adapted to generate a negation signal of the comparison data input signals $D_1$ through $D_{32}$.

Two-input NOR circuits 36, 37 and 62 other identical, two-input NOR circuits (not shown) generate signals on terminals 38, 39 which become comparison input signals $D_1$, $\overline{D_1}$ in the circuit shown in FIG. 1. When the output signal 40 from the decoder 34 is an H level, an L level signal is outputted from both terminals 38, 39. When the output signal 40 from the decoder 34 is an L level, a negation signal of the comparison input signal $D_1$ and the like is outputted from the terminal 38 and an affirmation signal of comparison input signal $D_1$ and the like is outputted from the terminal 39.

A $\overline{CS}$ signal input terminal is an input terminal which is used for enabling comparison and write operation. When the $\overline{CS}$ signal is an L level, the memory device is activated to carry out comparison and write operation. When the $\overline{CS}$ signal is H level, the output signals 40 from the decoder circuit 34 is an H level, so that the terminals 38, 39 become an L level. In this case, since PMOSs M5, M6 are not conductive in the comparison operation and the data line pairs are not driven to L level in the write operation, as described with reference to the example shown in FIG. 1, neither the comparison nor the write operation is carried out.

In FIG. 6, a $\overline{TST}$ signal input terminal serves as a signal input terminal for switching either to a comparison operation carried out for all bits or a test operation (that is, comparison operation for each bit is carried out). When a $\overline{TST}$ signal is an H level, all the outputs from two-input NOR circuits 27, 28, 31, 32 and the six other, identical two-input NOR circuits (not shown) become an L level. Accordingly, all the outputs from the decoder 34 become an L level, and the comparison input signals on all terminals 38, 38 for 32 bits become negation and affirmation signals, respectively, of the comparison input signal for carrying out a comparison operation of all bits. In the write operation, a write operation is carried out for all bits of input data.

When the $\overline{TST}$ signal is an L level, output signals from two-input NOR circuits 27, 28, 31, 32 and six, other, identical two-input NOR circuits become negation for the input signals. As a result, the output signals 40 from the decoder circuit 34 become ordinary decoded outputs. Only one output signal 40 from one decoder circuit 34 becomes an L level, and all the outputs from other decoder circuits 34 become an H level. Similarly, in the circuit shown in FIG. 1, only comparator circuit for one bit corresponding to the address signals $A_{D0}$ through $A_{D4}$ is activated and the other comparing circuits are not activated, carrying out a comparison operation for one-bit. Also, in write operation, write operation of corresponding one-bit is similarly carried out.

As mentioned above, in the combination of the circuits shown in FIGS. 1 and 6, it is possible to examine the memory cells for each bit by carrying out the comparison operation of one-bit.

It is also possible that a differential voltage occurred on the data line pair as a result of reading operation of the memory cell can be read by a sensing and amplifying circuit used in a usual memory device for examining memory cell. In this case, a low power consumption feature of the memory device is not lost by activating the sensing and amplifying circuit for reading only on the examination.

The comparison operation in any one bit may also be stopped by rendering an H level in both comparison input data such as $D_1$, $\overline{D_1}$ in the FIG. 1. For example, an appropriate logical circuit such as a mask register is formed and both comparison input data $D_1$, $\overline{D_1}$ are rendered H level. It is apparent that a comparison control operation having such a mask operation is not limited to one-bit, but may be extended to desired bit units.

Figure 7:
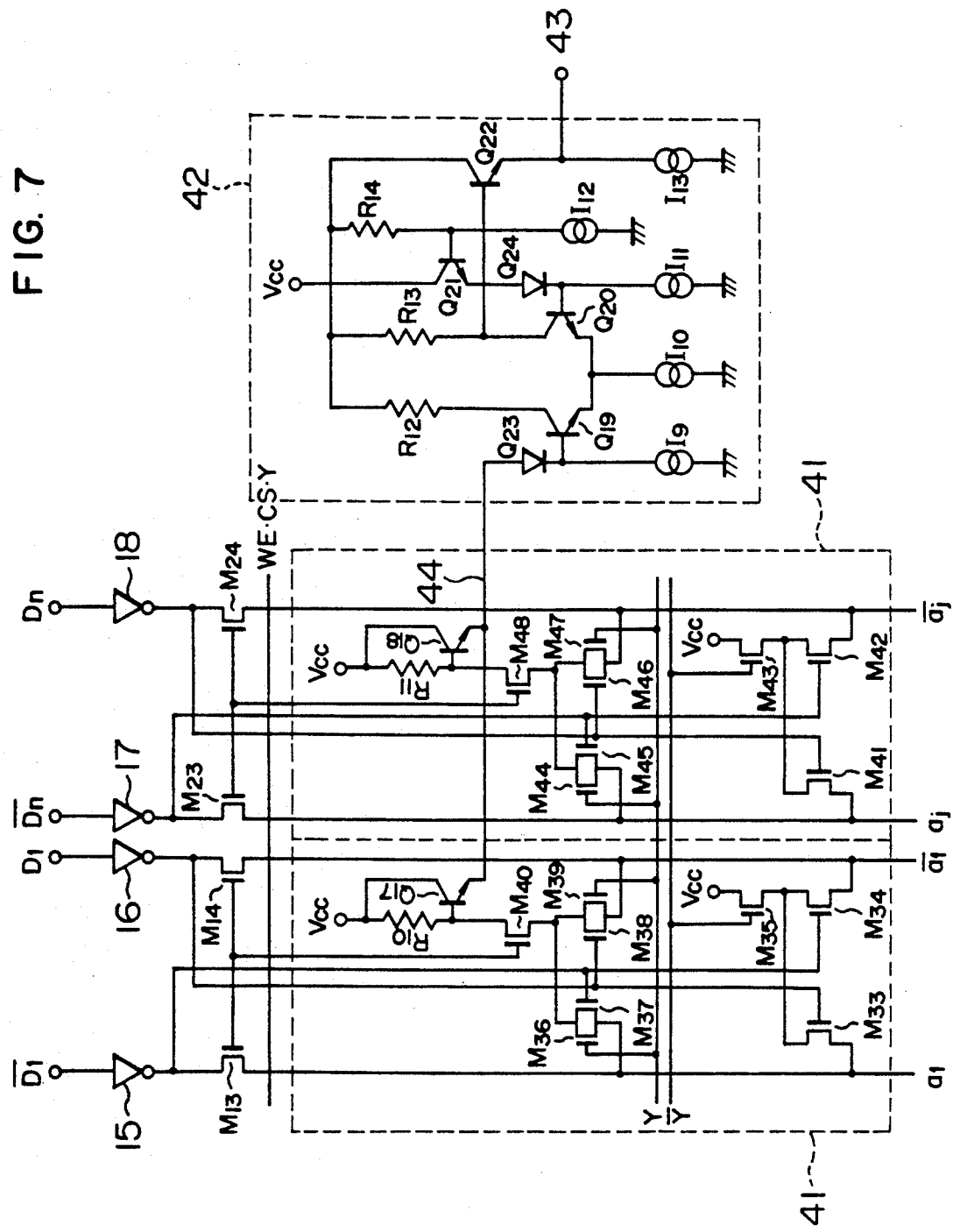
FIGS. 7 and 8 are circuit diagrams showing a comparator circuit and a sensing and amplifying circuit in accordance with the first embodiment of the present invention.

FIG. 7 is a circuit diagram showing another embodiment of a comparison circuit which is preferable to be applied to the memory device in the present invention. This embodiment is a modification of the first embodiment shown in FIG. 1.

In FIG. 7, the same reference numerals in FIG. 1 are used in FIG. 7 for the same construction. A reference numeral 41 denotes a comparison circuit of one bit, 44 a wired logical circuit, 42 a sensing and amplifying circuit, 43 an n-bit comparison result signal. A memory array is not shown in FIG. 7.

A circuit shown in FIG. 7 has a feature that a comparison operation is carried out in accordance with EOR (Exclusive OR) logic in the comparison circuit, and thereafter an OR logical operation is carried out by the wired logical circuit 44 to obtain a n-bits comparison result.

Since PMOSs M33 through M48 shown in FIG. 7 function similarly to PMOSs M5 through M12, M15 through M22 shown in FIG. 1, respectively, the detailed description of them is omitted for the sake of simplicity.

The PMOSs M5 through M7 or M15 through M17 form a comparison circuit, and PMOSs M8 through M12, or M18 through M22 form a bypass circuit for readout current in the circuit shown in FIG. 1, while PMOSs M33 through M35 or M41 through M43 form a bypass circuit for readout current, and PMOSs M36 through M40, or M44 through M48 form a comparison circuit shown in FIG. 7. There are differences between embodiments shown in FIGS. 1 and 7.

That is, in the circuit shown in FIG. 7, EOR logical operation is carried out between readout information of a comparison input signal by the EOR logical circuit comprising PMOSs M36 through M40 or M44 through M48 without converting a readout current from the memory cell into voltage information and a readout current which is an output of the EOR logical circuit flows through resistor elements R10 or R11. A one-bit comparison result which assumes an L level when both signals match with each other and an H level when there is a mismatch present, is obtained at a base electrode of NPN transistors Q17 and Q18.

A wired OR circuit connected emitter follower circuit comprising NPN transistors Q17, Q18, a signal line 44, a diode connected NPN transistor Q23 and a constant current source $I_9$ outputs at a cathode electrode of the transistor Q23, an n-bit comparison result which assumes an L level ($Vcc - 2V_{BE} - i_R R_{10}$) and an H level ($Vcc - 2V_{BE}$) when both signals match with each other on all bits and when they do not match with each other even on only one bit, respectively. $V_{BE}$ represents a forward bias voltage across the base and the emitter of the NPN transistor.

NPN transistors Q19 and Q20, resistor elements $R_{12}$ and $R_{13}$ and a constant current source $I_{10}$ constitute a differential amplifier circuit. NPN transistor Q22 and a constant current source $I_{13}$ constitute an emitter-follower output circuit. And at anode node 43, an amplified n-bit comparison is obtained.

A resistor element R14, NPN transistor Q21, a diode like connected NPN transistor Q24 and constant current sources $I_{11}$ and $I_{12}$ form a circuit for supplying the differential amplifying circuit with a reference voltage. For example, the reference voltage may be preset to a value ($Vcc - 2V_{BE} - 0.5 \cdot i_R \cdot R_{10}$) by presetting $I_{12} = i_R$, $R14 = R10/2$, $I_{11} = I_9$.

A memory device having a fast comparing capability at low power consumption is realized in the circuit shown in FIG. 7 since comparison operation is carried out by a combination of EOR circuits and wired OR circuits without converting the readout current from the memory cell into voltage information, similar to the embodiment in FIG. 1.

The circuit of this example has advantages in that the potential level of the data lines is approximately that of a voltage of the power source Vcc. Moreover immunity against soft radiation error caused by α-rays is excellent and the number of load elements driven by the readout current from the memory cell is smaller than that in the example of FIG. 1.

Although the example shown is that of an n-bit comparison result obtained by the wired OR circuit 44, the circuit may be divided into plural portions, in which a wired OR logical operation is carried out at a terminal 43 to lastly obtain the n-bit comparison result. The structure of the other circuits is not limited to the circuits in the present embodiment, and various changes are possible.

Figure 8:
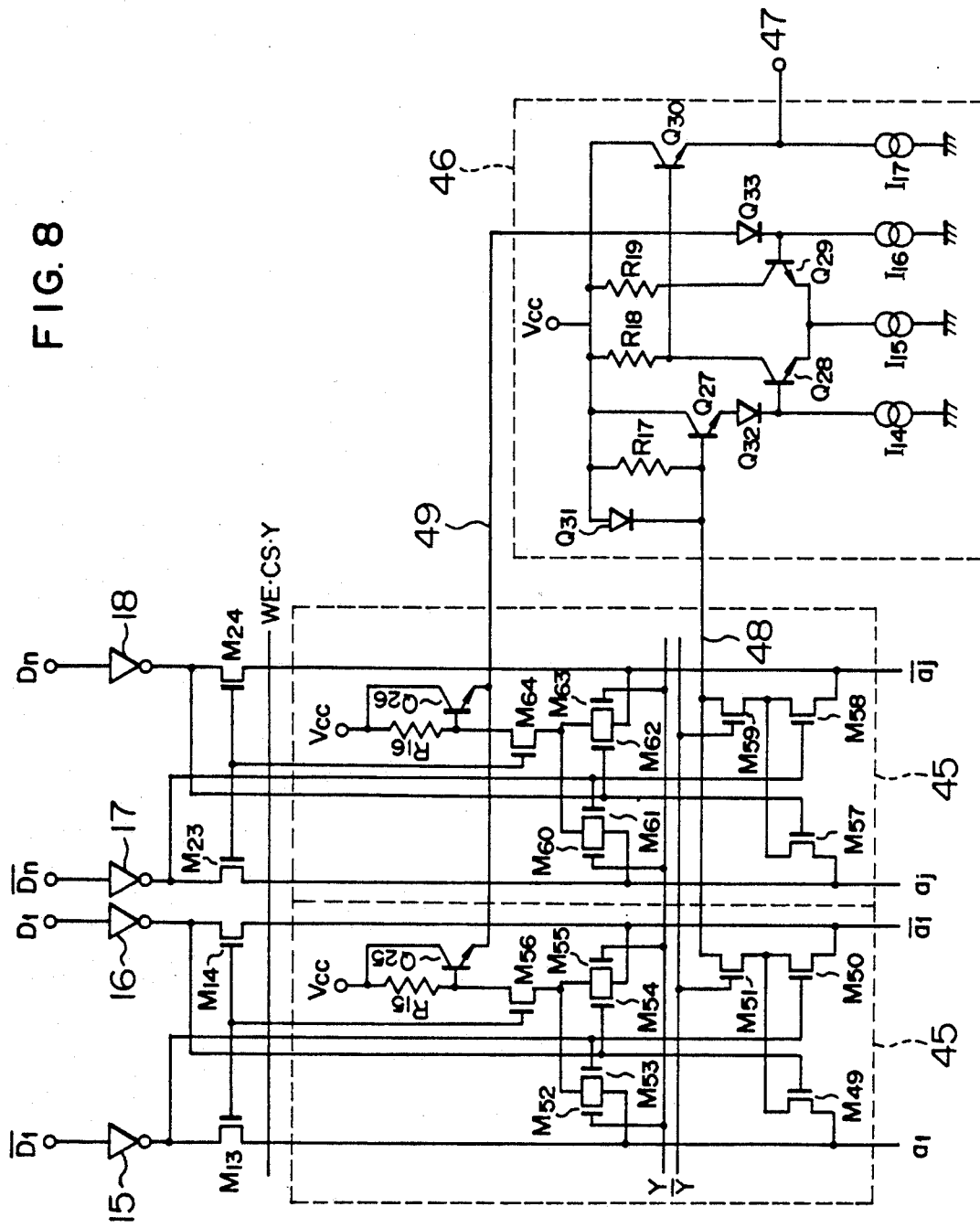

FIG. 8 is a circuit diagram showing another example a comparison circuit which may be preferably applied to the memory device of the present invention. The embodiment is a modification of the first embodiment.

In FIG. 8, the same reference numerals in FIG. 1 are used in FIG. 8 for the same construction. A reference numeral 45 denotes a comparison circuit for one bit, 48 and 49 denote wired logical circuits, 46 a sensing and amplifying circuit, 47 denotes an n-bit comparison result signal. Memory cells are not shown in FIG. 8.

The circuit shown in FIG. 8 has a feature that both a comparison operation in accordance with the EOR logic and a comparison operation in accordance with the ENOR (Exclusive NOR) logic are carried out in the comparison circuit 45, and thereafter an OR and AND logical operation is carried out by the wired logical circuits 49 and 48, respectively, so that both outputs from the OR and AND logics are inputted to a differential amplifier circuit as differential input signals to obtain an n-bit comparison result.

Since PMOSs M49 through M64 in FIG. 8 operate similarly to PMOSs M5 through M12, M15 through M22 in the FIG. 1, the detailed description of PMOSs M49 through M64 is omitted herein.

The circuit shown in FIG. 8 is different from the embodiments in FIGS. 1 and 7 in that the comparison circuit and the bypass circuit form an one-bit comparison circuit 3 or 41 in the latter, while a circuit comprising PMOSs M49 through M51, or a circuit M57 through M59, or PMOSs M52 through M56 or M60 through M64 or both of these circuit forms a comparison circuit in the former.

In the circuit shown in FIG. 8, an ENOR logical operation between a readout current from a memory cell and a comparison input signal is carried out in a circuit comprising PMOSs M49 through M51 or M57 through M59 and a wired AND logical operation is carried out by a signal line 48, a signal of which is converted into a voltage signal by a resistor element R17 and a clamping diode-like connected NPN transistor Q31. On the other hand, the EOR logical operation with a comparison input signal is carried out by a circuit comprising PMOSs M52 through M56 or M60 through M64 and a wired OR logical operation is carried out by resistor elements R15, R16, NPN transistors Q25 or Q26 and a signal line 49 similar to the example in FIG. 7.

In such a manner, a combination of the EOR circuit with the wired OR circuit and a combination of the ENOR circuit, with the wired AND circuit of this example, carry out a comparison operation without converting the readout current from the memory cell into voltage information and a comparison result is amplified by a differential amplifying circuit similar to the circuit of the example in FIGS. 1 and 2. This may realize a memory device having a high speed comparing capability and a low power consumption.

The circuit of this example has advantages in that the potential level of data lines is approximately equal to a power source voltage Vcc and immunity characteristics against soft radiation error caused by, for example, α-rays is excellent.

Although a resistor element is used for a portion which should function as an impedance element in FIGS. 1 through 8, it is apparent that an impedance element such as a MOSFET may be used in lieu of the resistor element.

An example of a second embodiment is now described in detail.

Figure 9:
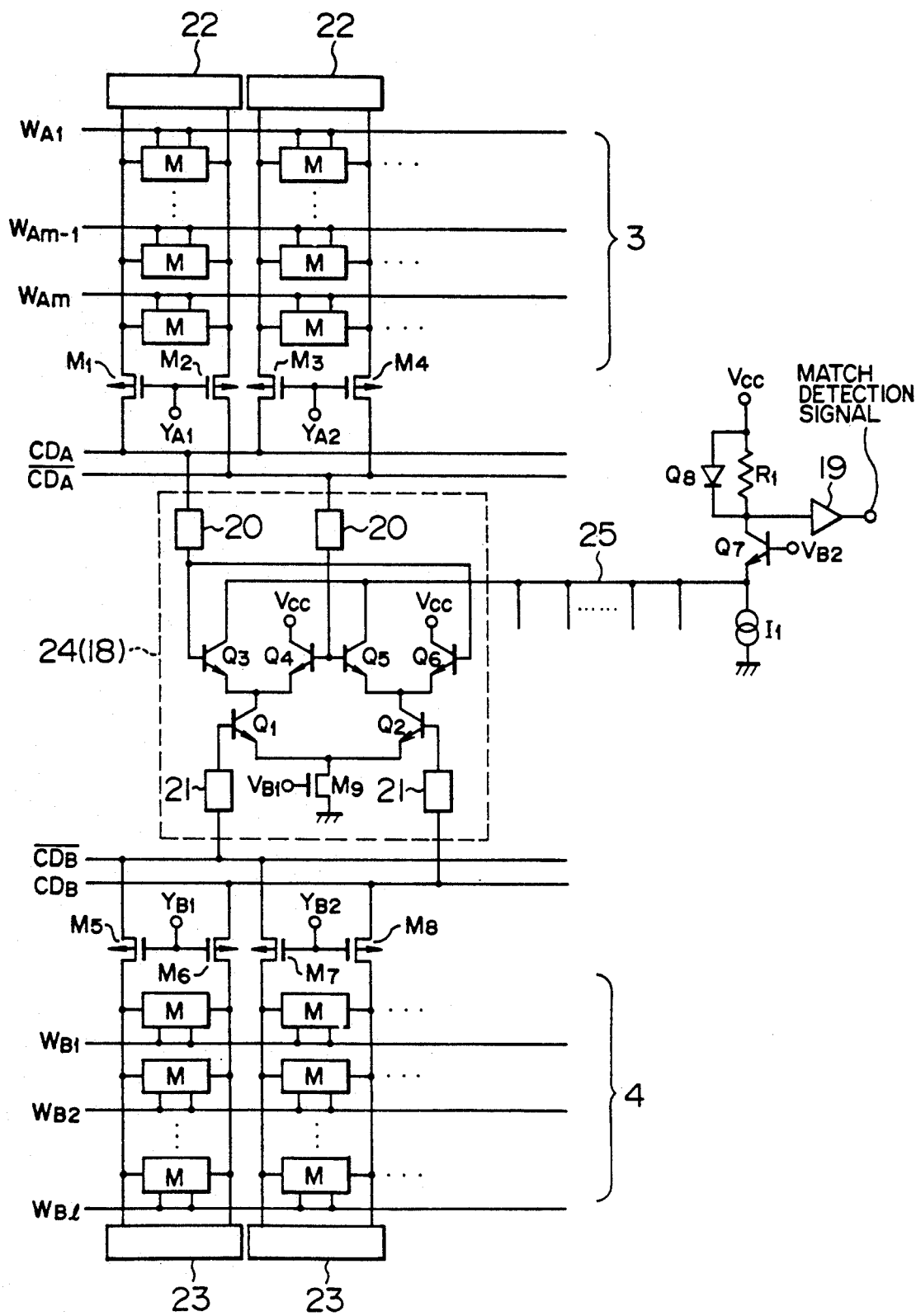
FIG. 9 is a circuit diagram showing an example of a circuit of a semiconductor memory device in accordance with a second embodiment of the present invention.
Figure 10:
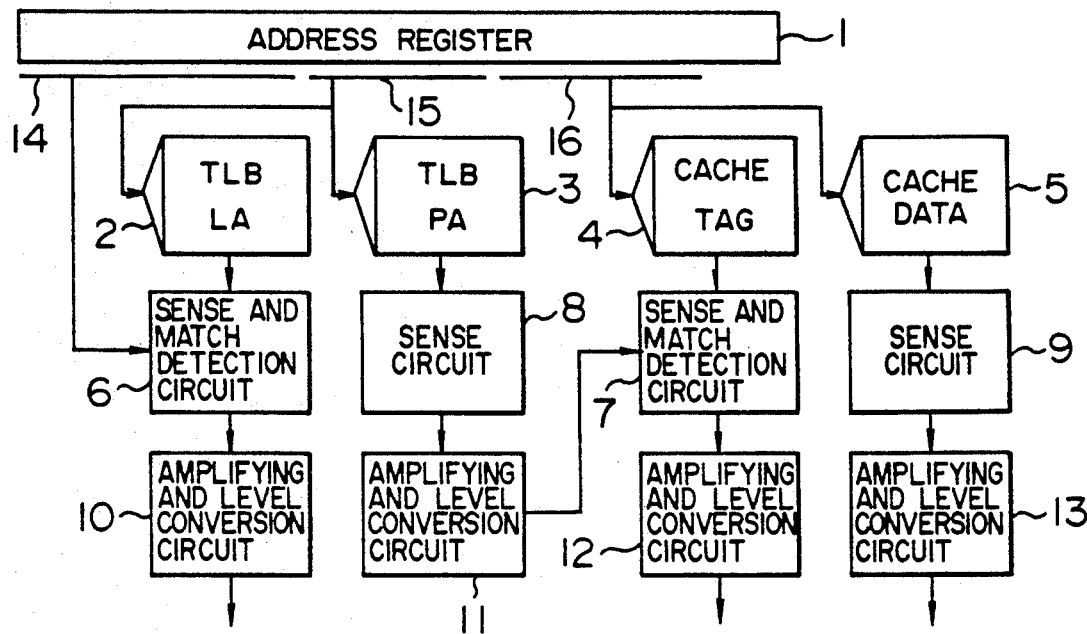
FIG. 10 is a block diagram showing a semiconductor memory device which was considered by present inventors prior to filing the present application.
Figure 11:
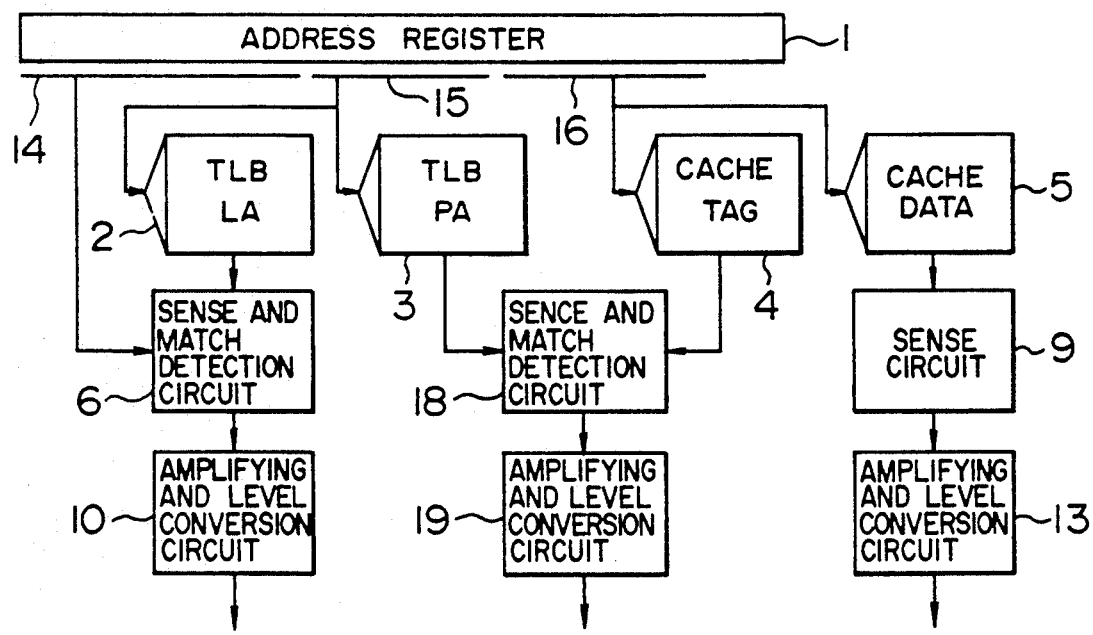
FIG. 11 is a circuit diagram showing an example of a semiconductor memory device in accordance with the second embodiment of the present invention.

FIGS. 9 and 11 are circuit diagrams showing a memory device of the second embodiment in the present invention. FIG. 10 is a block diagram showing an example of the structure of a memory device which has been considered by the present inventors prior to filing of the present application.

The structure and operation of the memory device in FIG. 11 is firstly described in contrast to the memory device in FIG. 10 which was considered prior to the filing of the present application.

FIGS. 10 and 11 are block diagrams showing a cache memory device for each which is a form of the structure of the memory device in which a TLB and an instruction and data cache memory are of direct map type for simplicity.

In the cache memory shown in FIG. 10, a reference numeral 1 denotes an address register, 2 a memory cell array (LA) for holding logic addresses of the TLB, 3 a memory cell array (PA) for holding physical addresses of the TLB, 4 a TAG memory of a cache memory, 5 a data memory of cache memory, 6 and 7 integrated sensing and matching detection circuits, 8 and 9 sensing circuits, 10 through 13 amplifying and level conversion circuits.

In a device shown in FIG. 11, the same reference numerals in FIG. 10 are used in FIG. 11 for the same construction. A reference numeral 18 denotes an integrated sensing and matching detection circuits, 19 an amplifying and level conversion circuit.

The cache memory devices in FIGS. 10 and 11 operate as follows: The TLB which functions as a buffer (address translation buffer) for translating logical addresses into physical addresses is accessed by an address bit 15 in the address register 1 so that an entry corresponding to address bit 15 is selected. A logical address and physical address which are held by the entry selected in accordance with the entry selection are readout from the memory cell array 2 (TLB LA) and the memory cell array 3 (TLB PA), respectively. The readout logical address is compared with the address bit 14 in the address register 1 by the integrated sensing and matching detection circuit 6. The result of the comparison is outputted from the amplifying and level conversion circuit 10 as a matching detection signal of the TLB (TLB hit or miss signal).

If the integrated sensing and matching detection circuit 6 can use a circuit which is described in Japanese Patent Application No. JP-A-63-119096, advantages of a speed-up and low power consumption could be obtained.

On the other hand, the instruction or data cache memory is accessed by an address bit 16 in the address register 1 so that an entry corresponding to the address bit 16 is selected. As a result, the instruction or data or physical address which is held by the selected entry is readout from the data memory 5 and TAG memory 4, respectively. The readout instruction or data is detected by the sense circuit 9 and is outputted from amplifying and level conversion circuit 13 as readout data.

The readout data is data stored in the physical address which has been readout from the TAG memory. It is necessary to determine whether the physical address translated by the TLB matches with the physical address stored in the TAG memory data and to determine whether the readout data is actually needed by a central processing unit.

The above mentioned operation is carried out by the integrated sensing and matching detection circuit 7 which is the same type as the integrated sensing and matching detection circuit 6 in the device of FIG. 10. A matching detection signal of the cache memory (hit or miss signal of instruction or data cache) is outputted from the amplifying and level conversion circuit 12. In order to perform this operation, after the physical address which is readout from the TLB PA(3) is detected by the sense circuit 8, it is amplified by the amplifying and level conversion circuit 11 and the amplified signal should be inputted to the integrated sensing and matching detection circuit 7.

In contrast, in the cache memory device of the present invention, such as, in FIG. 11, a detection of matching between the physical address stored in the PA(3) of TLB and the physical address stored in the TAG memory (4) of the cache memory is carried out by a sensing and matching detection circuit 18 having integrated sensing and matching detection capabilities.

The sensing and matching detection circuit 18 having both integrated capabilities further senses both stored information, and thereafter accomplishes a matching detection based on a sensing result.

The matching detection signal from the sensing and matching detection circuit 18 is then amplified and level-converted to obtain a matching detection signal from the cache memory.

Therefore, the cache memory device in FIG. 11 can provide a matching detection signal from the cache memory without amplifying and level-converting the physical address read out from the TLB PA(3), contrary to that necessary for the cache memory device in FIG. 10. Accordingly, a speed-up of the cache memory can be accomplished.

Furthermore, the number of the amplifying and level converting circuits may be decreased and, therefore, the occupied area of the circuit and power consumption may be reduced.

A memory device having a matching detection capability which is the second embodiment is described in detail with reference to the circuit exemplarily shown in FIG. 9.

In the example of the circuit in FIG. 9, the same reference numerals in FIG. 11 are used in FIG. 9 for the same construction. A M denotes a memory cell; M1 through M8 denote P channel MOSFET (hereinafter abbreviated as PMOS) for switching columns; $Y_{A1}$, $Y_{A2}$, ..., $Y_{B1}$, $Y_{B2}$ column selection signals; $W_{A1}$ through $W_{Am}$, $W_{B1}$ through $W_{B1}$ word lines for the memory cell arrays 3 and 4, respectively; 22 and 23 data line load circuits for the memory cell arrays 3, 4, respectively; $CD_A$, $\overline{CD_A}$, $CD_B$, $\overline{CD_B}$ common data lines for memory arrays 3, 4; 20, 21 level shift circuits; 24 an integrated one-bit sensing and matching detection circuit; 25 a matching detection line; Q1 through Q7 NPN bipolar transistors (hereinafter abbreviated as NPN transistor); Q8 a diode like connected NPN transistor; M9 and N channel MOSFET (hereinafter abbreviated as NMOS for constant current source); $V_{B1}$ and $V_{B2}$ bias voltages; R1 a resistive impedance element; $I_1$ a current source; Vcc a positive supply voltage of a Power source.

The memory cell M of the memory cell arrays 3, 4 may include a memory cell using MOS transistors, high resistance load type memory cell or complete CMOS type memory cell, or bipolar transistor type memory cell, or hybrid type memory cell of MOS transistors and bipolar transistors.

In the circuit shown in FIG. 9, an ECL circuit 24 of series gate type operates as the integrated sensing and matching detection circuit 18 which has been described with reference to FIG. 11. Accordingly, it senses the readout signal from the memory cell arrays 3, 4 and carries out matching detection in accordance with a matching detection logic (Exclusive NOR).

That is, after a difference signal having a very small signal swing which is readout from the memory cell M of the memory cell array 4 is sensed by ECL transistors Q1 and Q2 in the lower part of the integrated sensing and matching detection circuit 24 (18), the sensed signal is converted into a large difference signal between collector currents of the ECL transistors Q1 and Q2.

After a difference signal having a very small signal which is readout from the memory cell M of the memory cell array 3 is sensed by ECL transistors Q3 and Q4 in the upper part of the integrated sensing and matching detection circuit 24 (18), the sensed signal is converted into a large difference signal among collector currents of the ECL transistors Q3, Q4, Q5 and Q6.

Therefore, a switching capability of the differential currents on the path between the collector and emitter of the ECL transistors Q1, Q2, Q3, Q4, Q5 and Q6 performs a matching detection of the readout signals from the memory cell arrays 3, 4.

If the data which are readout via the common data line pairs $CD_A$, $\overline{CD_A}$, $CD_B$, $\overline{CD_B}$ match with each other a constant current from the constant current source NMOS M9 flows through Q1, Q4 or Q2, Q6 to the power source Vcc when both $CD_A$, $CD_B$ are an L level or both $CD_A$, $CD_B$ are an H level, respectively.

If the data do not match with each other, the constant current from the constant current source NMOS M9 flows via Q1, Q3 (in case of $CD_A$=H level, $CD_B$=L level) to the matching line 25 or via Q2, Q5 (in case of $CD_A$=L level, $CD_B$=H level) to the matching line 25.

Level shift circuits 20, 21 are adapted to shift the potential of the common data line $CD_B$, $\overline{CD_B}$, $CD_A$, $\overline{CD_A}$, for operating the ECL NPN transistors Q1 through Q6 and may comprise, for example, NPN transistors, constant current sources, and level shifting resistor elements.

The matching detection line 25 is connected by a wired logic with another sensing and matching detection circuit for carrying out a matching detection, which is identical with the sensing and matching detection circuit 24 for bit train. Since the wired logic function is a logical product (AND) circuit, the constant current does not flow through the matching detection line 25 if all bits of a bit train match with each other and the current flows through the matching detection line 25 if there is mismatching at least on one bit.

Transistors Q7, Q8, a resistor R1, and a constant current source I1 form a load circuit for the matching detection line 25. Both an H level and an L level signals are obtained at the collector of the transistor Q7 on matching and on mismatching respectively. The NPN transistor Q7 and the constant current source I1 reduce change in potential of the matching detection line by the base grounded circuit for a speedup. These may, of course, be omitted.

The diode like connected NPN transistor Q8 is provide as a low level clamp of the collector potential thereby preventing the transistor Q7 from being saturated with the detected current depending on the number of the bits which do not match with each other.

As mentioned above, in the circuit of the present example, the sensing and matching detection circuit 24, matching detection line 25 and a load circuit of the matching detection line 25 function as the integrated sensing and matching detection circuit 18 shown in block diagram shown in FIG. 11 and sense the readout signals from the memory arrays 3, 4 and hereafter carry out a matching detection.

The speed-up and low power consumption of the memory device having a matching detection capability which is the object of the present invention is accomplished.

In the example in FIG. 9, a case where a one-to-one correspondence exists between the memory cell data and the matching of which is detected, has being shown. However the circuit of this example is applicable to the case in which a plural-to-plural correspondence exists between data.

If the TLB and cache memory is a two-way set associative type in the example in FIG. 11, it is preferable that two sets of data read out from TLB PA(3) be compared in parallel with two sets of data read out from the TAG memory (4) of the cache memory to obtain four matching detection results in total. In this case, the memory cell arrays 3 and 4 in FIG. 9 have 2 sets of common data lines, respectively. It suffices to input data to four sets of integrated sensing and matching detection circuits. This provides advantages similar to the device shown in FIG. 9 in this case.

Figure 12:
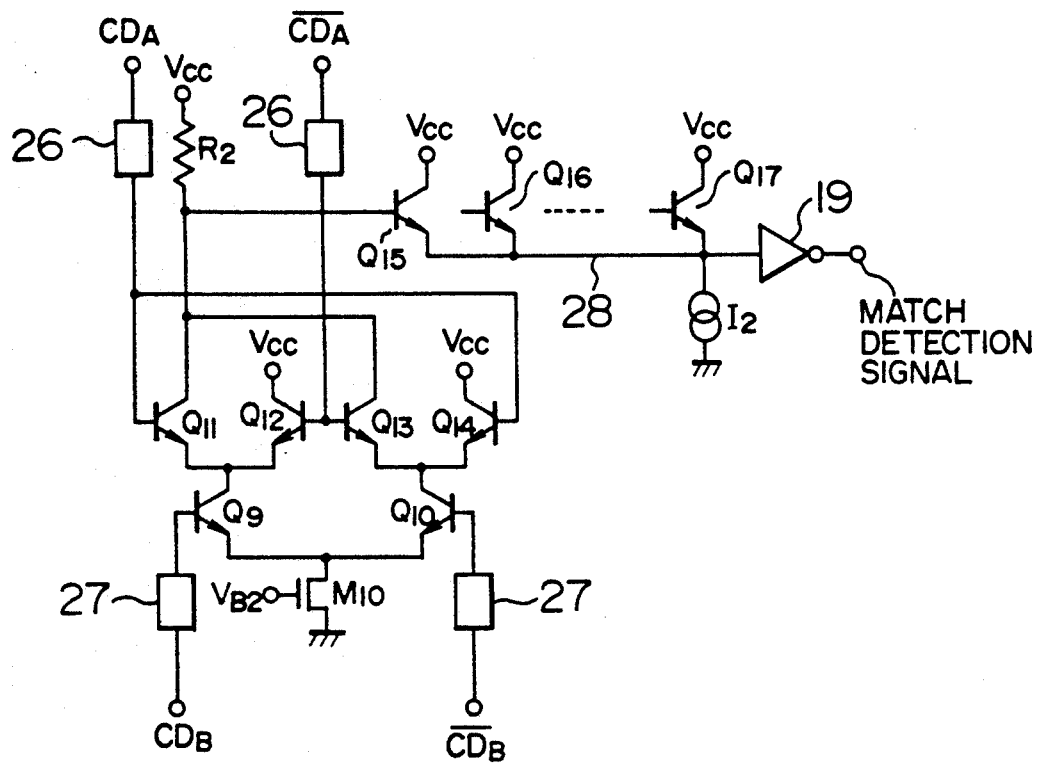
FIG. 12 shows a modification of a sensing and matching detection circuit 18 used in the semiconductor memory device in accordance with the second embodiment of the present invention.

FIG. 12 is a diagram showing a circuit of a second embodiment of the present invention which is preferably used for a memory device having a matching detection capability. The embodiment is a modification of the integrated sensing and matching detection circuit 18 shown in FIG. 11.

In FIG. 12, the same reference numerals in FIG. 9 are used in FIG. 12 for the same construction, reference numerals 26 and 27 denote a level shift circuit which carries out a function similar to those of circuits 20 and 21 in FIG. 9 and FIG. 11. ECL transistors Q9 through Q14, a constant current source NMOS M10 and a resistive impedance element R2 form a logical exclusive OR (EX OR) circuit. An emitter follower circuit comprising NPN transistors Q15 through Q17 having commonly connected emitters and a constant current source $I_2$ forms a wired OR circuit.

An EXNOR circuit is used for integrated sensing and matching detection circuit, and an AND circuit is used for detecting a matching of all bit train in the circuit shown in FIG. 9, while in the circuit shown in FIG. 12, EXOR and OR circuits are used in lieu of the EXNOR and AND circuits, respectively.

In the circuit shown in FIG. 12, the connection of the common data line pair $CD_B$, $\overline{CD_B}$ with the integrated sensing and matching detection circuit is reversed to that of the circuit shown in FIG. 9. If data-read out on the common data line pair $CD_A$, $\overline{CD_A}$ and $CD_B$, $\overline{CD_B}$ match with each other, a constant current from a constant current source NMOS M10 flows to a resistor element R2 via transistors Q9, Q11 (in case of $CD_A = CD_B = H$ level) or flows to the resistor element R2 via transistors Q10, Q13 (in case of $CD_A = CD_B = L$ level) so that the base potential of the NPN transistor Q15 assumes an L level.

If they do not match with each other, the readout current flows to the power source Vcc via transistors Q9, Q12 (in case of $CD_A = L$ level, $CD_B = H$ level) and flows to the power source Vcc via transistors Q10, Q14 (in case of $CD_A = H$ level, $CD_B = L$ level) so that the potential at the base of the transistor Q15 assumes an H level. The matching detection line 28 is connected with the sensing and matching detection circuit for detecting a matching which is identical with the circuit for a bit train, and NPN transistors Q16, Q17 and the like by a wired OR logic.

Accordingly, if all bits of a bit train match with each other, the matching detection line 28 assumes an L level. If there is no mismatching for at least one bit, the matching detection line 28 assumes an H level. Thus, a matching detection output signal having a logical level opposite to that of a signal on the matching detection line 28 may be obtained via an inverter 19.

As mentioned above, the circuit showing FIG. 12 can operate as an integrated sensing and matching detection circuit 18 shown in block diagram of FIG. 11, similar to the example in FIG. 9, and can accomplish an object of the present invention. Also, the circuit has a memory device which has a high speed operation and low power consumption and also has a matching detection capability.

Figure 13:
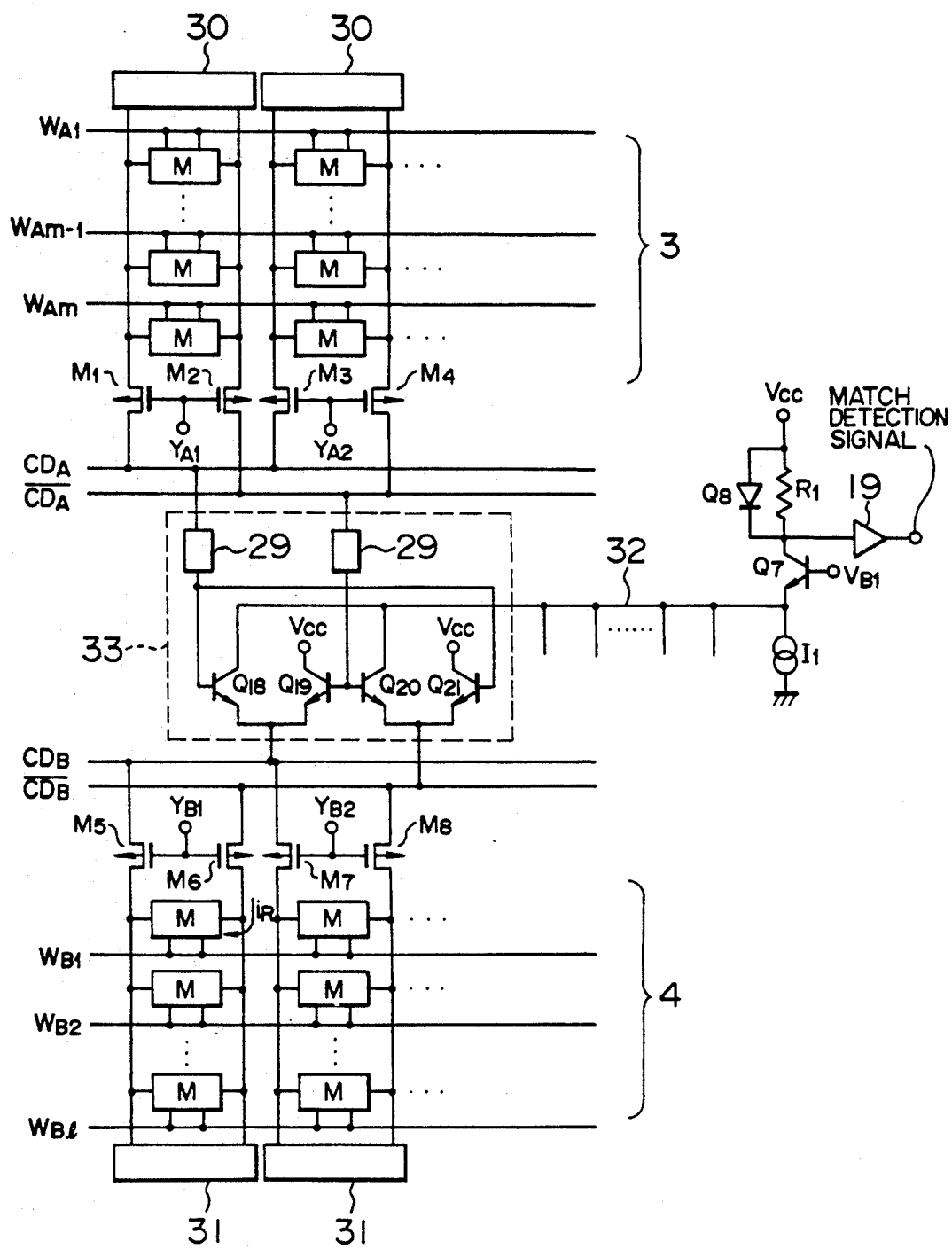
FIGS. 13 and 14 are circuit diagrams showing another example of a semiconductor memory device in accordance with the second embodiment of the present invention.

FIG. 13 shows another example of a semiconductor memory device having a matching detection capability.

In FIG. 13, the same reference numerals in FIGS. 9 and 11 are used in FIG. 13 for the same construction. A reference numeral 29 denotes a level shift circuit which carries out substantially similar functions to the circuits 20, 21 shown in FIG. 9.

In FIG. 13, a circuit 33 comprising ECL connected NPN transistors Q18 through Q21 and the level shift circuit 29 is an integrated one-bit sensing and matching detection circuit. A reference numeral 32 denotes a matching detection line; 30 and 31 denote load circuits of data line.

The circuit 33 shown in FIG. 13 has a feature that a readout current $i_R$ from the memory cell M of the memory cell array 4 is provided in lieu of an ECL differential switch current generated by the constant current source NMOS M9 and the transistors Q1 and Q2 of the integrated sensing and matching detection circuit 24 shown in FIG. 9.

In other words, the readout current $i_R$ from the memory cell M of the memory cell array 4 is directly subjected to current sensing at the emitters of the ECL connected NPN transistors Q18 through Q21. This can provide a memory device having a low power consumption and simplification of the circuit.

The memory cell array 3 and its pheripheral circuit shown in FIG. 13 is identical with that shown in FIG. 9 in the structure and operation. The level shift circuit 29 and NPN transistors Q18 through Q21 operate similarly to the level shift circuit 20 and the NPN transistors Q3 through Q6. On the contrary, the circuit structure of the memory cell array 4 and its pheripheral circuit is different from that of FIG. 9.

That is, in the circuit shown in FIG. 9, the readout current $i_R$ from the memory cell is caused to flow through the load circuit 23 of the data line for converting current information into voltage information once. Thereafter the converted information is returned to current information once by a differential sensing circuit comprising NMOS M9 and NPN transistors Q1 and Q2. In contrast to this, the circuit shown in FIG. 13 does not carry out a conversion between current and voltage twice, but causes the readout current $i_R$ from the memory cell directly to flow to emitters of the NPN transistors Q18, Q19 or Q20, Q21.

Accordingly, the operation of the data line load circuit 31 of the memory cell array 4 in FIG. 13 is different from that of the data line load circuits 23 of the memory array 4 shown in FIG. 9. The load circuits 31 operates to cause the readout information of a current to flow if the readout information from the memory cell generated on the relevant data line is not sensed by the sense and matching detection circuit 33.

For example, if column selection signals $Y_{B1}$ and $Y_{B2}$ are L and H levels, respectively, the data line load circuit 31 corresponding to column selection signal $Y_{B1}$ is turned off so that the readout current from the memory cell flows to the sensing and matching detection circuit 33 via PMOS M5 or M6, while PMOSs M7 and M8 in the column corresponding to $Y_{B2}$ of the non-selected column are turned off and the data line load circuit 31 is turned on so that the readout current from the memory cell flows to the data line load circuit 31.

The operation of matching detection is basically identical with that in FIG. 9. In case of a match under $CD_A = DC_B = H$ level, the readout current $i_R$ from the memory cell flows through $\overline{CD_B}$ and to a power source Vcc via a transistor Q21. In case of mismatch under $CD_A = CD_B = L$ level, the current $i_R$ flows through $CD_B$ and to the power source Vcc via the transistor Q19. In case of mismatch under $CD_A = H$ level, $CD_B = L$ level, the current $i_R$ flows through $CD_B$ and to the matching detection line 32 via the transistor 18. In case of mismatch under $CD_A = L$ level, $CD_B = H$ level, the current $I_R$ flows through $\overline{CD_B}$ and to the matching detection line 32 via the transistor Q20.

The above mentioned circuit operation enables the circuit shown in FIG. 13 to sense the readout signal from the memory cell array simultaneously with the matching detection by the integrated sensing and matching detection circuit 33, a wired AND circuit including a matching detection line 32 and a load circuit including a resistor element R1 similar to the circuit shown in FIG. 9.

The circuit shown in FIG. 13 does not require the constant current source NMOS M9 and ECL transistor Q1 and Q2 in FIG. 9 and is advantageous in low power consumption and simplicity of circuit.

In the circuit shown in FIG. 13, there shows a circuit for performing matching detection by an EXNOR circuit and a wired AND circuit. This circuit may be replaced with a circuit for performing a matching detection by an EXOR circuit and a wired OR circuit. The circuit may include a combination of the EXNOR circuit with the AND circuit and a combination of the EXOR circuit with the OR circuit and an amplifying and level conversion circuit 19 which amplifies output differential signals from the both combinations.

Figure 14:
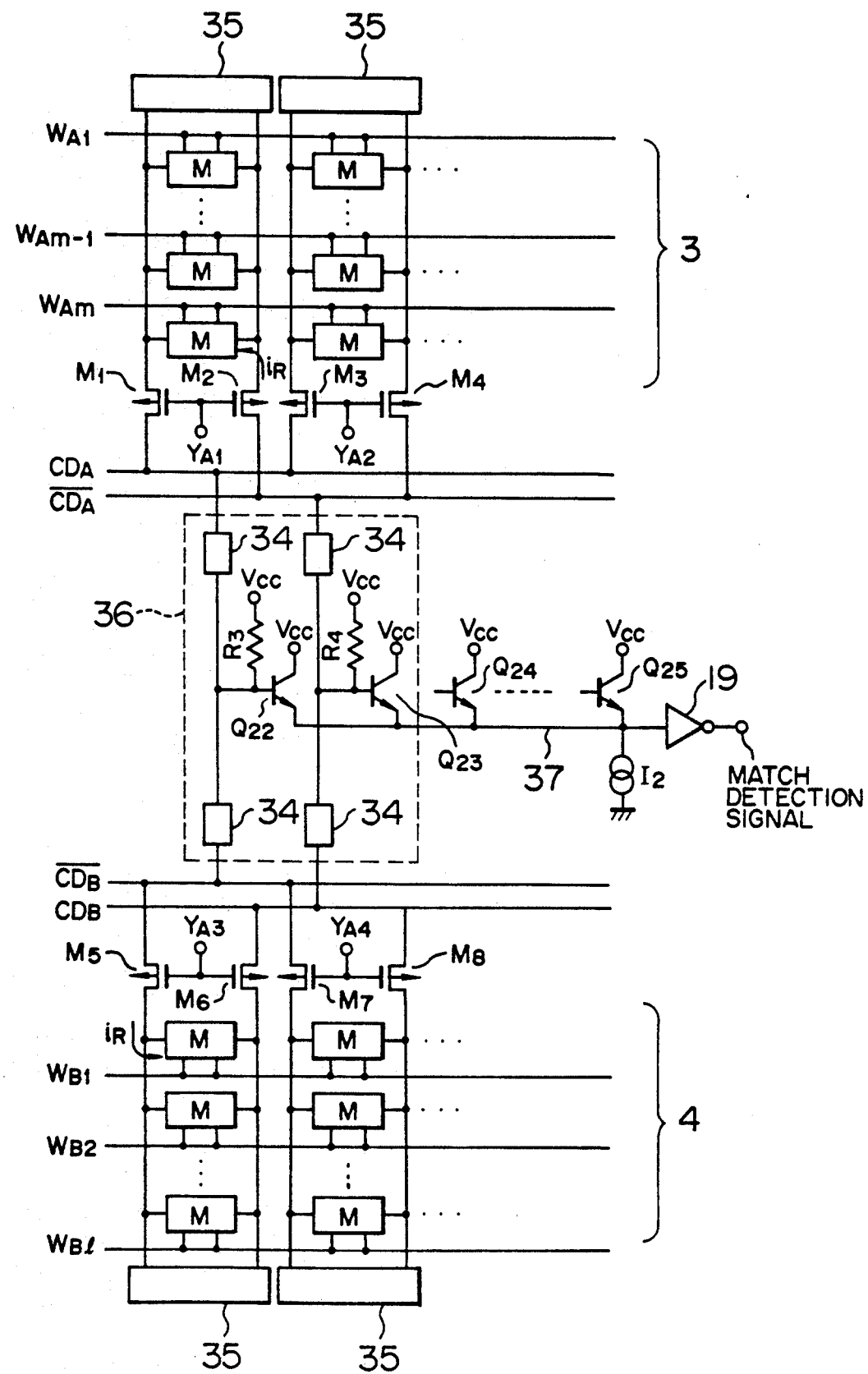

FIG. 14 shows another example of the semiconductor memory device having a matching detection capability.

In FIG. 14, the same reference numerals in FIG. 9, FIGS. 11 and 12 are used in FIG. 14 for the same construction. A reference numeral 34 denotes a level shift circuit.

A circuit 36 comprising NPN transistors Q22, Q23, resistive impedance elements R3, R4 and the level shift circuits 34 form an integrated one-bit sensing and matching detection circuit. A reference numeral 37 denotes a matching detection line. A circuit comprising NPN transistors Q22 through Q25 and a current source $I_2$ is a wired OR circuit. A reference numeral 35 denotes a load circuit for a data line identical with the load circuit for the data line in FIG. 13.

In the circuit shown in FIG. 14, a readout current $i_R$ from a memory cell is directly subjected to current sensing at four input terminals of an integrated one-bit sensing and matching detection circuit 36.

If content in a memory cell M of a memory cell array 3 matches with content in a memory cell M of a memory cell array 4, both the same value of the readout currents $i_R$ flow through two common connection nodes, respectively, of the level shift elements 34 connected with four sense input terminals. If both contents do not match with each other, substantially double readout current $2 \cdot i_R$ flows through one of two common connection nodes and substantially zero current flows through the other node.

In such a manner, the integrated one-bit sense and matching detection circuit 36 performs direct current sense of the readout currents $i_R$ of memory cells of both arrays 3, 4 and thereafter performs matching detection based on the current sense result. In order to facilitate signal processing, the matching detection current signal is converted into a matching detection voltage signal by means of resistors R3 and R4 as shown in FIG. 14 and then AND logical operation of readout data from a plurality of memory cells is performed by wired logic.

Detailed operation of the circuit of FIG. 14 is as follows:

If matching detection of stored contents between corresponding memory cells of the memory cell arrays 3, 4 is not performed, data line load circuits 35 operate to by pass the read-out current $i_R$ form each memory cell M. If matching detection of both stored contents is performed, the data line load circuits 35 are cut off, resulting in that the readout current $i_R$ from each memory cell M will flow to the sense and matching detection circuit 36 where it is subjected to current sense.

In case of match under $CD_A = CD_B = H$ level, the readout current $i_R$ from each memory cell array flows to the resistor elements R4 and R3 via $\overline{CD_A}$ and $\overline{CD_B}$, respectively.

In case of match under $CD_A = CD_B = L$ level, the current $i_R$ flows to the resistors R3 and R4 via $CD_A$ and $CD_B$, respectively. Accordingly, in case of match, both base electrodes of the NPN transistors Q22, Q23 assume L level.

In case of mismatch under $CD_A = H$ level, $CD_B = L$ level, the current $i_R$ flows to R4 via $\overline{CD_A}$ and $CD_B$, respectively. The base electrode of the transistor Q23 assumes L level while the base electrode of the transistor Q22 assumes H level. In case of mismatch under $CD_A = L$ level, $CD_B = H$ level, the current $i_R$ flows to R3 via $CD_A$ and $\overline{CD_B}$, respectively. The base electrode of the transistor Q22 assumes L level while the base electrode of the transistor Q23 assumes H level. Accordingly, in case of mismatch, the base electrode of either one of the transistors Q22 or Q23 assumes H level.

Therefore, similarly to other circuit for detecting matching of other bits of bit train, wired OR connected with the matching detection line 37, the matching detection line 37 assumes L level only when all bits match with each other and assumes L level even when there is a mismatching of at least one bit.

In accordance with the above mentioned circuit operation, the circuit of FIG. 14 senses the readout signal from the memory cell array and then performs matching detection based on the sense result by means of the integrated sense and matching detection circuit 36, and the wired OR circuit including the matching detection line similarly to the circuit of FIG. 13.

In the circuit of FIG. 14, the level shift circuits 34 are not always required to include a diode characteristic since information given to a common connections between the level shift circuits 34 is current information, and does not have to be level shifted. The level shift circuit 34 may be removed and direct connection is allowed.

In order to write different information into the memory arrays 3 and 4 simultaneously, the level shift circuits 34 may each include, for example, PMOS a switch so that read and write signals are inputted to the gate for turning the PMOS switch on and off on writing and reading, respectively.

Although wired OR Logical operation is performed to obtain n-bit comparison result in the example of FIG. 14, n-bit comparison result may be obtained by performing wired logic OR operation of the NPN transistors Q22 and Q23 and then by performing level shifting, i.e., by converting a voltage signal into a current signal by means of a differential sense circuit using a reference voltage and by performing a wired AND logic operation similarly to the example in FIG. 9 to obtain n-bit comparison result.

It is apparent that the present invention is not limited to above mentioned detailed examples, and various changes may be made within the sprit and the scope of the appended claims.

In accordance with the present invention, there is provided a fast and low power consumption memory device having comparing and matching detection capabilities.

In accordance with the first embodiment of the present invention, comparison of information stored in the memory cell with comparison input information is accomplished by a comparison circuit without any conversion of a readout current from the memory cell into voltage information. Therefore, signal processing such as voltage conversion prior to comparison operation at the comparison circuit may be omitted. Outputs from a plurality of comparison circuits may be synthesized by a wired logical circuit. It will suffice to dispose one sense circuit for converting a readout current, flowing from a memory cell to the synthesized output, into a voltage. Thus, the present invention may provide a fast and low power consumption memory device having comparing and matching detection capabilities.

In accordance with the second embodiment, detection of matching of first information outputted from a first memory cell array with second information outputted from a second memory cell array is performed by an integrally formed sense and matching detection circuit which is characterized as providing both the sensing and matching operations. The integrally formed sense and matching detection circuit senses both stored information and thereafter performs matching detection based on the sense detection. Since both stored information is sensed firstly even if any of the stored information is very small and matching detection is performed based on the sense result, the likelihood of a malfunction is remarkably reduced. The sense and matching detection circuit which is integrally provided with the sense and matching detection capabilities is very advantageous in promoting speed-up and low power consumption.

What is claimed is:

1. A semiconductor memory device, comprising:
a plurality of memory cells for storing information; and
a plurality of comparator circuits each of which being coupled for respectively comparing units of information stored in ones of said plurality of memory cells with comparison input information, corresponding to each unit of the information, and outputting a result of each comparison,
wherein readout currents from ones of said plurality of memory cells being read out are respectively supplied to corresponding ones of said plurality of comparator circuits without first being converted into a voltage,
wherein each one of said plurality of comparator circuits provides a comparison operation of readout current from a selected one of corresponding ones of said plurality of memory cells with comparison input information supplied thereto, and
wherein each of the comparator circuits includes a MOSFET having a source-drain path which is supplied with the readout current from the selected memory cell and having a gate which is supplied with the comparison input information.

2. A semiconductor memory device, comprising:
a plurality of memory cells for storing information; and
a plurality of comparator circuits each of which being coupled for respectively comparing units of information stored in ones of said plurality of memory cells with comparison input information, corresponding to each unit of the information, and outputting a result of each comparison,
wherein readout currents from ones of said plurality of memory cells being read out are respectively supplied to corresponding ones of said plurality of comparator circuits without first being converted into a voltage,
wherein each one of said plurality of comparator circuits provides a comparison operation of readout current from a selected one of corresponding ones of said plurality of memory cells with comparison input information supplied thereto, and
wherein each of the comparator circuits includes a bipolar transistor having an emitter-collector path which is supplied with the readout current from the selected memory cell and having a base which is supplied with the comparison input information.

3. A semiconductor memory device according to claim 1, wherein outputs of said plurality of comparator circuits are connected with a matching detection line which effects a wired logic function, and wherein a matching detection signal is outputted to said matching detection line in accordance with the respective comparison results of said plurality of comparator circuits.

4. A semiconductor memory device according to claim 3, wherein said matching detection signal outputted to said matching detection line includes the readout current of the selected memory cell.

5. A semiconductor memory device according to claim 4, wherein said matching detection line is connected to a sensing circuit from which a matching detection voltage signal is generated.

6. A semiconductor memory device according to claim 3, further including a plurality of output circuits respectively provided for said plurality of comparison circuits, wherein each output circuit is coupled to a respective comparison circuit and comprises an emitter follower circuit, the emitter of said emitter follower circuit is an output thereof connected with said matching detection line.

7. A semiconductor memory device, comprising:
a first memory array including a plurality of memory cells for storing information;
a second memory array including a plurality of memory cells for storing information; and
a matching detection circuit for comparing information stored in one of said plurality of memory cells selected from said first memory cell array with information stored in one of said plurality of memory cells selected from said second memory cell array and for outputting a matching detection signal based on a result of the comparison,
wherein a readout signal from the selected memory cell from said first memory cell array and a readout signal from the selected memory cell from said second memory cell array are supplied to said matching detection circuit without requiring amplification of voltage signal representations thereof, and
wherein said matching detection circuit includes an integrally arranged sensing and matching detection circuit for sensing the readout signal from the selected memory cells and thereafter carrying out a matching detection by said sensing and matching detection circuit based on the sensing result.

8. A semiconductor memory device according to claim 7, wherein said sensing and matching detection circuit which integrally performs the sensing and matching detection operations includes at least ECL transistors, one of said ECL transistors having a base which is supplied with the readout signal from a first one of the selected memory cells and each of said ECL transistors having a collector-emitter path which performs a switching function associated with a differential current to carry out the matching detection.

9. A semiconductor memory device according to claim 8, wherein the differential current includes the readout current from the selected memory cell from said second memory cell array.

10. A semiconductor memory device according to claim 7, wherein the readout current from the selected memory cell from said first memory cell array, corresponding to said first one of the selected memory cells, and the readout current from the selected memory cell from the second memory cell array are applied to the sensing and matching detection circuit, the applied readout currents are sensed by the sensing and matching detection circuit, and wherein the sensing and matching detection circuit has a plurality of resistors for converting a plurality of matching detection currents based on the sensing result into voltages and a plurality of bipolar transistors, each base of which is supplied with the voltage from each of the resistors, and each emitter of which is connected with a matching detection signal line.

11. A semiconductor memory device according to claim 7, wherein the first memory cell array includes a memory array for storing physical address of an address translation cache, and wherein the second memory cell array includes a tag array for storing address of an instruction or data cache.

12. A semiconductor memory device according to claim 6, wherein said matching detection line performs a wired AND logic operation.

13. A semiconductor memory device according to claim 12, wherein each one of said plurality of comparator circuits includes means for performing an exclusive NOR logic operation.

* * * * *